(12) United States Patent
Mao et al.

(10) Patent No.: US 9,991,910 B2
(45) Date of Patent: Jun. 5, 2018

(54) TRANSMITTER POWER SUPPLY WITH SELECTIVE SOURCE AND REGULATION

(71) Applicant: Avago Technologies General IP (Singapore) Pte. Ltd., Singapore (SG)

(72) Inventors: Weiwei Mao, Macungie, PA (US); Andrew Cable, Hudson, WI (US); Brett Hardy, Chaska, MN (US); Christopher John Abel, Morgan Hill, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 74 days.

(21) Appl. No.: 15/162,500

(22) Filed: May 23, 2016

(65) Prior Publication Data

US 2017/0338840 A1   Nov. 23, 2017

(51) Int. Cl.
*H02M 3/156* (2006.01)
*H04B 1/04* (2006.01)
*H03M 9/00* (2006.01)

(52) U.S. Cl.
CPC .............. *H04B 1/04* (2013.01); *H02M 3/156* (2013.01); *H03M 9/00* (2013.01)

(58) Field of Classification Search
CPC ... H03M 9/00; H04L 25/03343; H02M 3/158; H02M 3/1584; H02M 3/156; Y02B 70/16; H03F 1/0211; H04B 1/04
See application file for complete search history.

(56) References Cited

U.S. PATENT DOCUMENTS

| | | | | |
|---|---|---|---|---|
| 6,313,693 | B1 * | 11/2001 | Kelm | G05F 1/569 307/19 |
| 7,403,035 | B1 * | 7/2008 | Shumarayev | H03K 19/17784 326/37 |
| 8,289,798 | B2 * | 10/2012 | Coteus | G11C 5/147 365/226 |
| 8,520,348 | B2 | 6/2013 | Dong | |
| 2008/0129219 | A1 * | 6/2008 | Smith | H02M 3/1584 315/291 |
| 2012/0032656 | A1 * | 2/2012 | Hoon | H04L 25/0278 323/268 |
| 2012/0169403 | A1 * | 7/2012 | Gupta | H04L 25/0272 327/530 |
| 2014/0269975 | A1 * | 9/2014 | Chong | H04L 25/028 375/295 |
| 2015/0023398 | A1 | 1/2015 | Ren et al. | |

* cited by examiner

*Primary Examiner* — Michelle M Koeth
(74) *Attorney, Agent, or Firm* — Sheridan Ross P.C.

(57) ABSTRACT

An apparatus for powering an electrical circuit includes a first voltage input configured to receive power from a first voltage source, a second voltage input configured to receive power from a second voltage source, wherein the second voltage source has a lower voltage than the first voltage source, a voltage regulator connected to the first voltage input, and a voltage output configured to switchably receive power from the first voltage input through the voltage regulator or from the second voltage input.

20 Claims, 3 Drawing Sheets

TRANSMITTER POWER SUPPLY WITH SELECTIVE SOURCE AND REGULATION

FIELD OF THE INVENTION

Various embodiments of the present invention provide for a power supply with selective source and voltage regulation, in some cases powering a transmitter voltage mode driver in a normal amplitude mode or a reduced amplitude mode.

BACKGROUND

Electronic circuits such as voltage mode drivers in Serializer and Deserializer (SerDes) systems can have varying output voltage requirements. The driver normally consumes a relatively large amount of power to regulate the voltage and drive the data across the channel. Where lower than normal output voltage is required, the driver power consumption is much larger than necessary.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components.

DETAILED DESCRIPTION OF THE INVENTION

Figure 1:
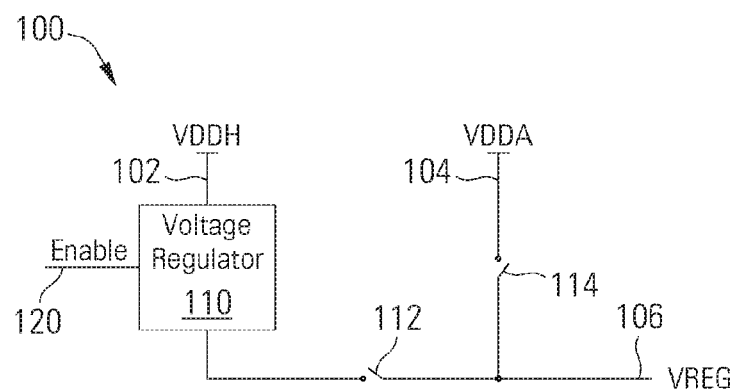
FIG. 1 depicts a power supply with selective source and regulation, in which a switch is provided for each input voltage supply in accordance with some embodiments of the present invention.

Embodiments of the present invention are related to a power supply with selective source and voltage regulation, in some cases powering a transmitter voltage mode driver in a normal amplitude mode or a reduced amplitude mode. A power supply with selective source and voltage regulation is configured to draw power from one of multiple input power sources, such as from voltage sources of different levels. In some embodiments, for example, the power supply with selective source and voltage regulation has two voltage inputs, one connected to a higher voltage level and another connected to a lower voltage level. In some embodiments, the power supply with selective source and voltage regulation can be configured to draw power from either a VDDH voltage input or a VDDA voltage input in which the VDDH voltage level is higher than the VDDA voltage level. In some cases, for example, the VDDH voltage input receives a voltage level between about 1.5V and 1.8V, and the VDDA voltage input receives a voltage input level between about 850 mV and 1V, although these voltage levels are merely non-limiting examples for illustrative purposes. Similarly, although the acronyms VDDH and VEDA applied to the input voltages in some embodiments refer to transistor drain supply voltages, the power supply with selective source and voltage regulation is not limited to powering any particular type of load or circuit and the input voltages can be referenced to other applications.

The power supply with selective source and voltage regulation also selectively enables and disables voltage regulation based upon which supply voltage source is selected. For example, some embodiments of the power supply with selective source and voltage regulation are configured to regulate the output voltage when drawing power from the VDDH supply voltage input and to disable voltage regulation when drawing power from the VDDA supply voltage. In some other embodiments, voltage regulation characteristics are altered rather than enabled and disabled based upon which supply voltage source is selected.

By configuring the power supply with selective source and voltage regulation to select from among multiple supply voltage sources and to control whether voltage regulation is enabled or disabled, the power supply can meet various load requirements while reducing power consumption. For example, when powering a transmitter voltage mode driver such as in a serializer/deserializer (SerDes), the power supply can be configured to draw power from the higher VDDH supply voltage input and to regulate the output voltage for typical data channel conditions, and to draw power from the lower VDDA supply voltage input and to disable output voltage regulation for shorter data channel conditions. This reduces power consumption in the voltage regulation when the transmitter output voltage can be reduced for shorter data channels without negatively impacting the ability to successfully transmit data over the channel. In normal applications, the transmitter is powered by the VDDH supply voltage through the power supply operating in large output mode, with voltage from the power supply to the transmitter regulated in the power supply by any suitable voltage regulator circuit. When the data channel is shorter or the output voltage requirements are reduced for any other reason, the power supply with selective source and voltage regulation is placed in a reduced amplitude mode in which it draws power from the lower VDDA supply voltage input and disables output voltage regulation. This can significantly reduce the power consumption in the power supply when operating in the reduced amplitude mode with voltage regulator disabled.

Turning to FIG. 1, a power supply 100 with selective source and regulation is depicted, in which a switch is provided for each input voltage source in accordance with some embodiments of the present invention. The power supply 100 has two voltage inputs, a higher voltage source VDDH 102 and a lower voltage source VDDA 104. The power supply 100 is configured to draw electrical current from the higher voltage source VDDH 102 for example when powering a voltage mode transmitter driver in a SerDes system to achieve a high transmitter output voltage, e.g., about 1200 m Vpp. This can be referred to as a large output or large amplitude operating mode. The power supply 100 is configured to draw electrical current from the lower voltage source VDDA 104 when powering the voltage mode transmitter driver in a SerDes system to achieve a lower transmitter output voltage, e.g., about 400 m Vpp. This can be referred to as a low output or reduced amplitude operating mode. Again, voltages presented herein are merely examples for illustrative purposes and the power supply 100 with selective source and regulation can be adapted for use with any input and output voltage levels and any number of input voltage sources.

The large amplitude mode can be used, for example, when the channel in the SerDes system is a typical or normal length in which the higher transmitter output voltage is needed to transmit data over the channel in a recoverable fashion. The reduced amplitude mode can be used, for example, when the channel in the SerDes system is a shorter length in which the higher transmitter output voltage is not needed and a lower voltage to the voltage mode transmitter driver is sufficient to transmit data over the channel in a recoverable fashion. The determination of which operating mode to use, and which voltage input to apply to the power supply 100, can be made based on any suitable criteria, such as the signal to noise ratio of the data at the receiver, or the bit error rate of the data as it is detected and decoded in the receiver, etc. Based upon the disclosure herein, one of ordinary skill in the art will recognize a number of applications for the power supply 100 with selective source and regulation and a number of criteria that can be used to determine which input to apply to the power supply 100.

The power supply 100 with selective source and regulation includes a voltage regulator 110 that can be enabled or disabled by a voltage regulator enable signal 120. The voltage regulator 110 can be any circuit or device configured to regulate or control the output voltage from the voltage regulator 110. The voltage regulator 110 can for example provide a 1200 m Vpp output voltage based on an input voltage between about 1.5V to 1.8V from higher voltage source VDDH 102. The voltage regulator 110 can use any design or topology, such as, but not limited to, linear regulators, switching regulators, etc. Based upon the disclosure herein, one of ordinary skill in the art will recognize a variety of circuits or devices that can be used to implement voltage regulator 110. The voltage regulator 110 can be enabled and disabled in any suitable manner, such as, but not limited to, gating power to circuits within the voltage regulator 110, controlling feedback or other control signals, etc. Disabling the voltage regulator 110 reduces or eliminates power consumed in regulating the input voltage to the voltage regulator 110 to yield the output voltage.

In the example embodiment of FIG. 1, a switch 112 connects and disconnects the higher voltage source VDDH 102 through the voltage regulator 110 to the output voltage VREG 106, and another switch 114 connects and disconnects the lower voltage source VDDA 104 to the output voltage VREG 106. The switches 112, 114 can be implemented in any suitable manner, such as, but not limited to, using one or more of any type of transistor in any switching configuration, electromechanical devices, etc. In some embodiments, the switches 112, 114 each comprise a field effect transistor having a gate controlled by control signals to open or close the switches 112, 114 to disconnect or connect the regulated output from the voltage regulator 110 or the lower voltage source VDDA 104 from/to the output voltage VREG 106. Based upon the disclosure herein, one of ordinary skill in the art will recognize a variety of switching circuits or devices that can be used to implement switches 112, 114.

Opening and closing of input select switches 112, 114 and enabling and disabling of the voltage regulator 110 can be controlled in any suitable manner. In some embodiments, a single control input to the power supply 100 receives a signal that selects the large amplitude mode or the reduced amplitude mode. When the large amplitude mode is selected, switch 112 is closed, voltage regulator 110 is enabled, and switch 114 is opened. This causes the power supply 100 to draw power from higher voltage source VDDH 102, disconnects lower voltage source VDDA 104 from the power supply 100, and enables the voltage regulator 110 so that the output voltage VREG 106 is a regulated voltage. When the reduced amplitude mode is selected, switch 114 is closed, voltage regulator 110 is disabled, and switch 112 is opened. This causes the power supply 100 to draw power from the lower voltage source VDDA 104, disconnects higher voltage source VDDH 102 from the power supply 100, and disables the voltage regulator 110 so that the output voltage VREG 106 is based directly on the voltage at lower voltage source VDDA 104 without further regulation, thereby reducing power consumption in the power supply TOO. This is referred to herein as a pass-through connection, which passes the VDDA 104 voltage through to the output without voltage regulation. In some other embodiments, the power supply 100 is provided with separate control inputs to control the voltage regulator enable signal 120 and the control signals to the input voltage source selection switches 112, 114. In these embodiments, control circuits or program code outside the power supply 100 implement the logic to appropriately control the switches 112, 114 and the voltage regulator 110 based on the desired operating mode or desired amplitude of the output voltage VREG 106.

Additional elements can be included in the power supply 100 as desired, to perform functions such as, but not limited to, filtering, biasing, monitoring, feedback, etc. Such additional elements can be performed on the voltage from VDDA 104 which is still referred to herein as a pass-through connection, meaning that the voltage level is not altered by voltage regulation. Furthermore, the power supply 100 can have multiple voltage outputs, having the same or different voltage levels, current capacity, etc.

Figure 2:
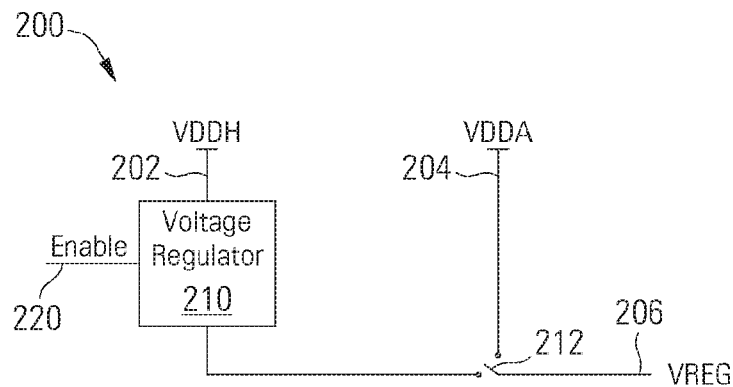
FIG. 2 depicts a power supply with selective source and regulation, in which a multi-throw switch is shared by multiple input voltage supplies in accordance with some embodiments of the present invention.

Turning to FIG. 2, a power supply 200 with selective source and regulation is depicted, in which a multi-throw switch is shared by multiple input voltage supplies in accordance with some embodiments of the present invention. The power supply 200 is configured to selectively draw power from one of two voltage inputs, a higher voltage source VDDH 202 and a lower voltage source VDDA 204. The power supply 200 is configured to draw electrical current from the higher voltage source VDDH 202 for example when powering a voltage mode transmitter driver in a SerDes system to achieve a high transmitter output voltage. The power supply 200 is configured to draw electrical current from the lower voltage source VDDA 204 when powering the voltage mode transmitter driver in a SerDes system to achieve a lower transmitter output voltage. Based upon the disclosure herein, one of ordinary skill in the art will recognize a number of applications for the power supply 200 with selective source and regulation and a number of criteria that can be used to determine which input to apply to the power supply 200.

The power supply 200 with selective source and regulation includes a voltage regulator 210 that can be enabled or disabled by a voltage regulator enable signal 220. The voltage regulator 210 can be any circuit or device configured to regulate or control the output voltage from the voltage regulator 210. Based upon the disclosure herein, one of ordinary skill in the art will recognize a variety of circuits or devices that can be used to implement voltage regulator 210. The voltage regulator 210 can be enabled and disabled in any suitable manner, such as, but not limited to, gating power to circuits within the voltage regulator 210, controlling feedback or other control signals, etc. Disabling the voltage regulator 210 reduces or eliminates power consumed in regulating the input voltage to the voltage regulator 210 to yield the output voltage.

In the example embodiment of FIG. 2, a multi-throw switch 212 connects and disconnects either the higher voltage source VDDH 202 through the voltage regulator 210, or the unregulated lower voltage source VDDA 204, to the output VREG 206. The switch 212 can be implemented in any suitable manner, such as, but not limited to, using one or more of any type of transistor in any switching configuration, electromechanical devices, etc. Based upon the disclosure herein, one of ordinary skill in the art will recognize a variety of switching circuits or devices that can be used to implement multi-throw switch 212.

The position of the multi-throw switch 212 can be controlled in any suitable manner. In some embodiments, a single control input to the power supply 200 receives a signal that selects the large amplitude mode or the reduced amplitude mode. When the large amplitude mode is selected, multi-throw switch 212 is switched to the path of the higher voltage source VDDH 202 and voltage regulator 210 is enabled. This causes the power supply 200 to draw power from higher voltage source VDDH 202, disconnects lower voltage source VDDA 204 from the power supply 200, and enables the voltage regulator 210 so that the output voltage VREG 206 is a regulated voltage. When the reduced amplitude mode is selected, multi-throw switch 212 is switched to the path of the lower voltage source VDDA 204 and voltage regulator 210 is disabled. This causes the power supply 200 to draw power from the lower voltage source VDDA 204, disconnects higher voltage source VDDH 202 from the power supply 200, and disables the voltage regulator 210 so that the output voltage VREG 206 is based directly on the voltage at lower voltage source VDDA 204 without further regulation, thereby reducing power consumption in the power supply 200. In some other embodiments, the power supply 200 is provided with separate control inputs to control the voltage regulator enable signal 220 and the control signal to the multi-throw switch 212. In these embodiments, control circuits or program code outside the power supply 200 implement the logic to appropriately control the multi-throw switch 212 and the voltage regulator 210 based on the desired operating mode or desired amplitude of the output voltage VREG 206.

Figure 3:
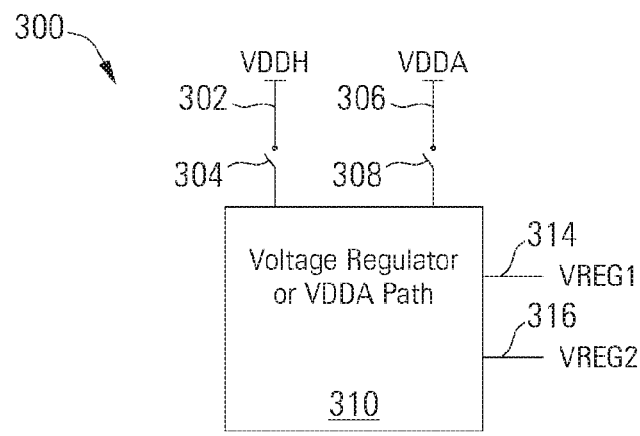
FIG. 3 depicts a power supply with selective source and regulation, in which a voltage regulator or VDDA path circuit provides an output voltage to multiple outputs based on a selection of input voltage supplies in accordance with some embodiments of the present invention.

Turning to FIG. 3, a power supply 300 with selective source and regulation is depicted, in which a voltage regulator or VDDA path circuit 310 provides an output voltage to multiple outputs 314, 316 based on a selection of input voltage sources 302, 306 in accordance with some embodiments of the present invention. A switch 304 connects or disconnects the higher voltage source VDDH 302 to the power supply 300, and another switch 308 connects or disconnects the lower voltage source VDDA 306 to the power supply 300. The power supply 300 is configured to selectively draw power from one of two voltage inputs, a higher voltage source VDDH 302 and a lower voltage source VDDA 306. The power supply 300 is configured to draw electrical current from the higher voltage source VDDH 302 for example when powering a voltage mode transmitter driver in a SerDes system to achieve a high transmitter output voltage. The power supply 300 is configured to draw electrical current from the lower voltage source VDDA 306 when powering the voltage mode transmitter driver in a SerDes system to achieve a lower transmitter output voltage. Based upon the disclosure herein, one of ordinary skill in the art will recognize a number of applications for the power supply 300 with selective source and regulation and a number of criteria that can be used to determine which input to apply to the power supply 300.

The voltage regulator or VDDA path circuit 310 includes a voltage regulator that regulates the voltage received from higher voltage source VDDH 302, but not the voltage received from lower voltage source VDDA 306, yielding a regulated voltage at one or more of the voltage outputs VREG1 314, VREG2 316. The voltage regulator or VDDA path circuit 310 provides an unregulated path from the lower voltage source VDDA 306 directly to one or more of the voltage outputs VREG1 314, VREG2 316.

The voltage regulator in the voltage regulator or VDDA path circuit 310 can be any circuit or device configured to regulate or control the output voltage(s) from the power supply 300. Based upon the disclosure herein, one of ordinary skill in the art will recognize a variety of circuits or devices that can be used to implement voltage regulator. The voltage regulator can be enabled and disabled in any suitable manner, such as, but not limited to, gating power to circuits within the voltage regulator, controlling feedback or other control signals, etc. Disabling the voltage regulator reduces or eliminates power consumed by the voltage regulation.

The power supply 300 has multiple voltage outputs VREG1 314, VREG2 316 in some embodiments in order to provide power to multiple loads or load circuit regions, such as different portions of a SerDes transmitter. The voltage outputs VREG1 314, VREG2 316 can have the same or different electrical characteristics, such as voltage amplitude, current capacity, etc. The input 302, 306 used for each output 314, 316 can be the same or can be different. Similarly, the voltage regulation applied in the voltage regulator or VDDA path circuit 310 can be the same or different for each of the voltage outputs VREG1 314, VREG2 316.

Opening and closing of input select switches 304, 308 and enabling and disabling of the voltage regulator in the voltage regulator or VDDA path circuit 310 can be controlled in any suitable manner. In some embodiments, a single control input to the power supply 300 receives a signal that selects the large amplitude mode or the reduced amplitude mode, and the power supply 300 sets the input select switches 304, 308 and enables or disables the voltage regulator accordingly. In some other embodiments, the power supply 300 is provided with separate control inputs to control the voltage regulator and the control signals to the input select switches 304, 308. In these embodiments, control circuits or program code outside the power supply 300 implement the logic to appropriately control the input select switches 304, 308 and the voltage regulator based on the desired operating mode or desired amplitude of the output voltages. In yet other embodiments, the power supply 300 enables and disables the voltage regulator in the voltage regulator or VDDA path circuit 310 automatically based on whether the higher voltage source VDDH 302 is closed or open, respectively.

Figure 4:
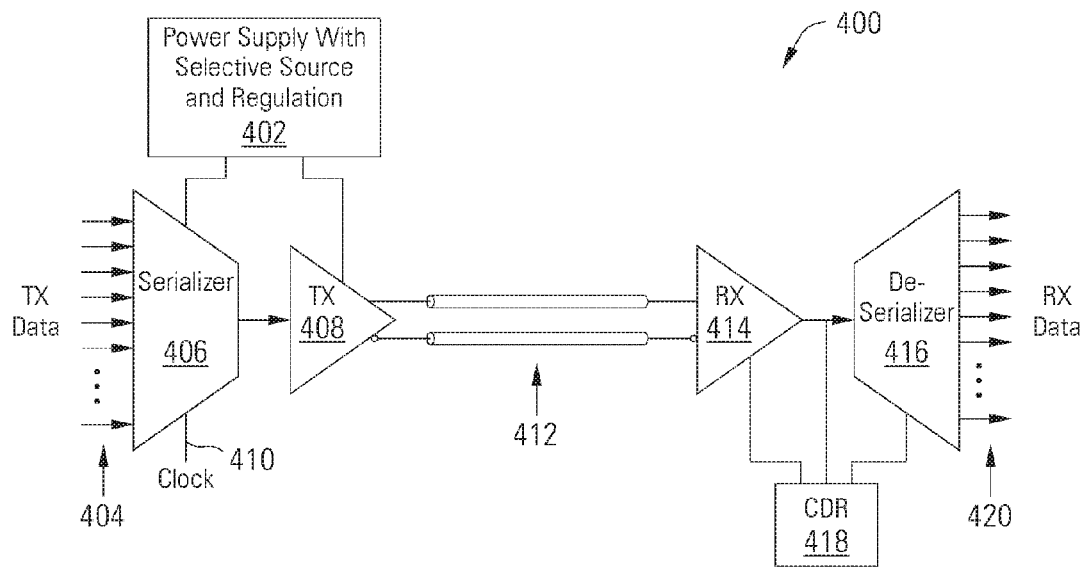
FIG. 4 depicts an electrical link system having a transmitter, channel and receiver, in which at least some elements of the transmitter are powered by a power supply with selective source and regulation in accordance with some embodiments of the present invention.

Turning to FIG. 4, a SerDes electrical link system 400 is depicted which includes a transmitter, channel and receiver. At least some elements of the transmitter are powered by a power supply with selective source and regulation in accordance with some embodiments of the present invention. Serializer/Deserializer (SerDes) circuits facilitate the transmission of data across a serial link, particularly in high speed digital communication systems. Data to be transmitted from a first location is serialized or converted from parallel data to serial data and is transmitted across a communications channel to a receiver at a second location, or stored in a storage device and then retrieved. In some embodiments, to recover the transmitted or stored information, the receiver samples an analog waveform and detects the sampled data in the process of converting back from serial data to parallel data.

A serializer 406 receives parallel data 404 and serializes the data, yielding a serial output. The serializer can include any suitable circuits, such as, but not limited to, multiplexers, to convert the parallel data 404 to a serial data stream. A transmitter 408 drives the serial data across a channel 412 or to a storage device. The transmitter 408 can use any suitable driver circuits, such as voltage mode drivers, and any suitable format, such as differential signals. A receiver 414 receives the data from channel 412, in some cases receiving the data as an analog signal to which a data detection algorithm is applied to recover digital data. A deserializer 416 converts the resulting serial data stream to parallel data 420. A clock and data recovery circuit 418 can be included in the receiver system to recover the clock associated with the data transmitted on the channel 412, enabling the receiver 414 and deserializer 416 to correctly receive and deserialize the data. A clock 410 can be included in the transmitter system to clock the deserializing of the data.

A power supply 402 with selective source and regulation is included in the transmitter of the SerDes electrical link system 400, powering some or all of the serializer 406 and/or transmitter 408. The power supply 402 with selective source and regulation is configured to selectively draw power from one of multiple voltage sources, such as, but not limited to, a higher voltage source VDDH and a lower voltage source VDDA. The power supply 402 can be configured to draw electrical current from the higher voltage source VDDH and to regulate the output voltage for example when the channel 412 is normal length. The power supply 402 can also be configured to draw electrical current from the lower voltage source VDDA and to disable output voltage regulation when the channel 412 is shorter than normal and a lower supply voltage is sufficient to successfully transmit the data. Disabling the voltage regulator reduces or eliminates power consumption in the power supply 402.

Figure 5:
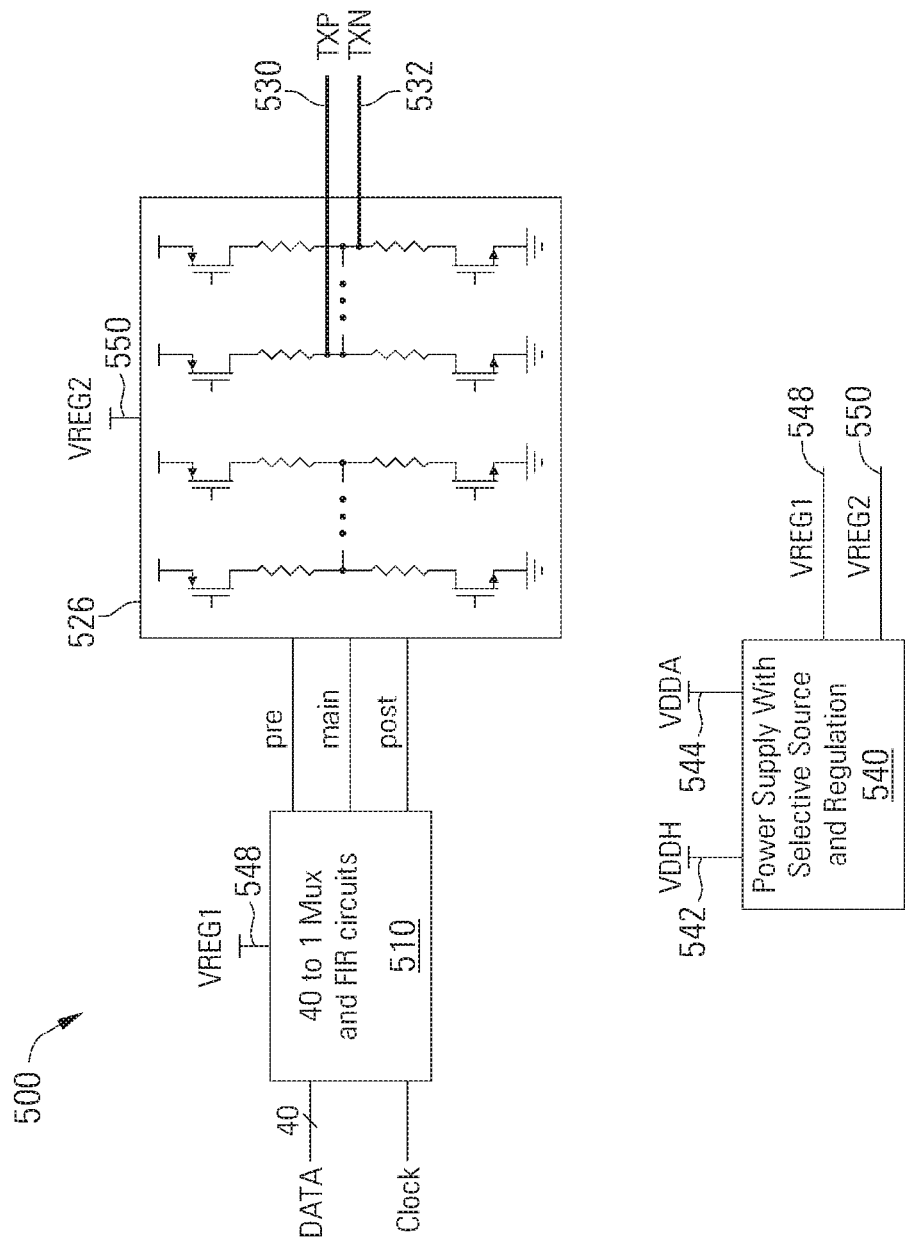
FIG. 5 depicts a SerDes transmitter with a voltage mode driver in which at least some elements of the transmitter are powered by a power supply with selective source and regulation in accordance with some embodiments of the present invention.

Turning to FIG. 5, a SerDes transmitter 500 is depicted which includes a voltage mode driver 526 in which at least some elements of the transmitter 500 are powered by a power supply 540 with selective source and regulation in accordance with some embodiments of the present invention. Parallel data is received on a parallel data input configured, for example, to receive 40 data bits in parallel. Multiplexers in a 40 to 1 mux and FIR circuit 510 successively reduce the number of parallel bits in the data to yield fully serialized signals. It is important to note that the width of the parallel data input is not limited to any particular number of bits, and in some cases, the transmitter may comprise a parallel or partially parallel data transmitter or driver.

In some embodiments, the 40 to 1 mux and FIR circuit 510 applies finite impulse response filtering to the serialized delayed signals according to different filter tap weights to shape the resulting waveform to be transmitted by voltage mode driver 526, yielding main-cursor, pre-cursor and post-cursor signals which enable pre-emphasis to be applied to the signal to be transmitted.

The voltage mode driver 526 can include any suitable circuit for driving the waveform based on the serialized data onto channel outputs 530, 532, such as, but not limited to, a differential voltage mode driver. In some embodiments, the voltage mode driver 526 includes H bridge drivers for each of the channel outputs 530, 532, comprising p-channel and n-channel field effect transistor pairs connected in an H topology to selectively set the direction of current flow through resistors in the H bridge to set the voltage on the channel outputs 530, 532. Based upon the disclosure herein, one of ordinary skill in the art will recognize a variety of driver circuits that can be used in a SerDes transmitter and powered by a power supply 540 with selective source and regulation in accordance with the present invention.

In some embodiments, other circuits are included in the transmitter 500 for various purposes.

The power supply 540 with selective source and regulation powers some or all of the transmitter 500 and is configured to selectively draw power from one of multiple voltage sources, such as, but not limited to, a higher voltage source VDDH 542 and a lower voltage source VDDA 544. The power supply 540 can be configured to draw electrical current from the higher voltage source VDDH 542 and to regulate the output voltage for example when the channel connected to channel outputs 530, 532 is normal length. The power supply 540 can also be configured to draw electrical current from the lower voltage source VDDA 544 and to disable output voltage regulation when the channel is shorter than normal and a lower supply voltage is sufficient to successfully transmit the data. Disabling the voltage regulator reduces or eliminates power consumption in the power supply 540.

In some embodiments, the power supply 540 has multiple voltage outputs VREG1 548, VREG2 550 in order to provide power to multiple loads or load circuit regions, such as different portions of the transmitter 500. The voltage outputs VREG1 548, VREG2 550 can have the same or different voltage amplitude or other electrical characteristics. Similarly, the voltage regulation applied in the power supply 540 can be the same or different for each of the voltage outputs VREG1 548, VREG2 550.

In the example embodiment of FIG. 5, part or all of the 40 to 1 mux and FIR circuit 510 is powered by the VREG1 output 548 from the power supply 540, the voltage mode driver 526 is powered by the VREG2 output 550 from the power supply 540, and in some cases, part of the SerDes transmitter 500 can be powered by VDDA 544. However, the power supply 540 is not limited to embodiments with multiple voltage outputs.

The power supply 540 with selective source and regulation enables selection of input source at different voltage levels for reduced amplitude mode applications and allows voltage regulation to be disabled. The power consumption of the power supply 540 and/or the transmitter driver or other load can thereby be significantly reduced. The introduction of the switch to one or more secondary voltage source(s) has no impact on the regulated power supply path of the transmitter driver in a normal operation mode. Furthermore, the same transmitter driver core structure can be used in both normal large amplitude mode and reduced amplitude mode.

Figure 6:
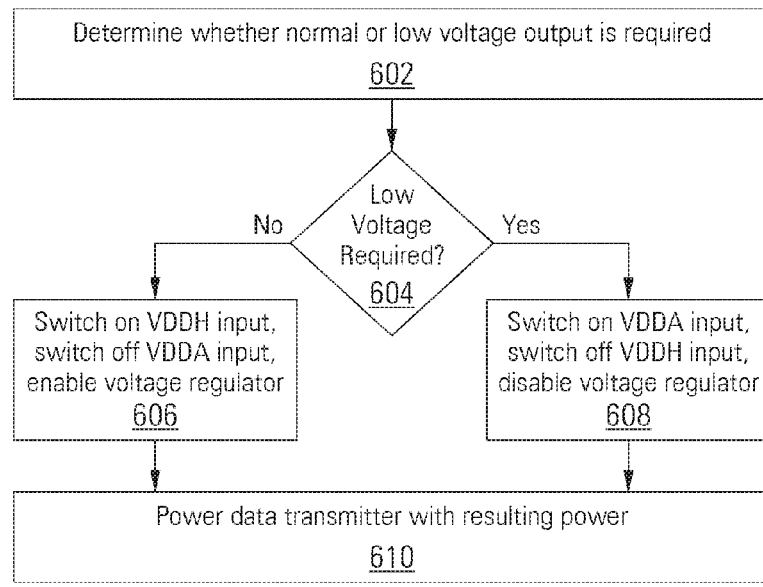
FIG. 6 is a flow diagram of an operation to power a transmitter, including selecting from among multiple input voltage supplies and enabling or disabling voltage regulation based on output voltage requirements in accordance with some embodiments of the present invention.

Turning to FIG. 6, flow diagram 600 depicts an operation to power a transmitter, including selecting from among multiple input voltage supplies and enabling or disabling voltage regulation based on output voltage requirements in accordance with some embodiments of the present invention. Following flow diagram 600, a determination is made as to whether normal or reduced voltage amplitude output is required. (Block 602) If the reduced voltage amplitude output is not required (Block 604), for example when powering a voltage mode SerDes transmitter with a normal channel, the VDDH input is switched on, the VDDH input is switched off, and the voltage regulator is enabled. (Block 606)

The power supply with selective source and regulation can be used to supply power to any load, such as, but not limited to, a voltage mode driver in a SerDes transmitter that transmits information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some cases, parts of a given system, block or circuit may be implemented in software or firmware, while other parts are implemented in hardware.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

In conclusion, embodiments of the present invention provide novel systems, devices, methods and arrangements for supplying power with selective source and voltage regulation. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. An apparatus for powering an electrical circuit, comprising:
   a first voltage input configured to receive power from a first voltage source;
   a second voltage input configured to receive power from a second voltage source, wherein the second voltage source has a lower constant voltage than the first voltage source;
   a voltage regulator connected to the first voltage input; and
   a first voltage output configured to switchably receive first constant regulated power from the first voltage input through the voltage regulator or constant unregulated power from the second voltage input based on a length of a single data channel connected to the first voltage output, and to power the electrical circuit,
   wherein the first voltage output receives the first constant regulated power from the first voltage input through the voltage regulator when the length of the single data channel is greater than a threshold length, and
   wherein the first voltage output receives the constant unregulated power from the second voltage input when the length of the single data channel is less than or equal to the threshold length.

2. The apparatus of claim 1, further comprising a switch between the first voltage input and the voltage regulator.

3. The apparatus of claim 1, further comprising a switch between the second voltage input and the first voltage output.

4. The apparatus of claim 1, further comprising a first switch between the first voltage input and the voltage regulator, and a second switch between the second voltage input and the first voltage output.

5. The apparatus of claim 1, further comprising a switch between the voltage regulator and the first voltage output.

6. The apparatus of claim 1, wherein the first voltage output is configured to switchably receive power from the first voltage input through the voltage regulator or directly from the second voltage input without voltage regulation.

7. The apparatus of claim 1, further comprising a multi-throw switch configured to switchably connect an output of the voltage regulator or the second voltage input to the first voltage output.

8. The apparatus of claim 1, further comprising a second voltage output configured to switchably receive power from the first voltage input through the voltage regulator or from the second voltage input.

9. The apparatus of claim 8, wherein the first voltage output and the second voltage output are configurable to receive power from a different one of the first voltage input through the voltage regulator and the second voltage input.

10. The apparatus of claim 8, wherein the first voltage output and the second voltage output are configurable to receive power from a same one of the first voltage input through the voltage regulator and the second voltage input.

11. The apparatus of claim 1, further comprising a voltage mode transmitter powered by the first voltage output, wherein the single data channel is connected to an output for the voltage mode transmitter.

12. The apparatus of claim 11, further comprising a serializer configured to provide data to the voltage mode transmitter, wherein at least some portion of the serializer is powered by the first voltage output.

13. A method for powering a transmitter, comprising:
determining whether a constant high amplitude voltage or a constant low amplitude voltage is needed to power the transmitter based on a length of a single data channel connected to an output of the transmitter;
when the constant high amplitude voltage is needed, switching off a low voltage supply input, switching on a high voltage supply input, and enabling voltage regulation of constant regulated power from the high voltage supply input to yield a voltage output having the constant high amplitude voltage;
when the constant low amplitude voltage is needed, switching off the high voltage supply input, disabling the voltage regulation of the constant regulated power from the high voltage supply input, switching on the low voltage supply input, and passing the constant low amplitude voltage from the low voltage supply input to the voltage output; and
powering the transmitter with the voltage output,
wherein the constant high amplitude voltage is needed when the length of the single data channel is greater than a threshold length, and
wherein the constant low amplitude voltage is needed when the length of the single data channel is less than or equal to the threshold length.

14. The method of claim 13, wherein switching off the high voltage supply input comprises opening a switch between the high voltage supply input and a voltage regulator and wherein switching on the high voltage supply input comprises closing the switch.

15. The method of claim 13, wherein switching off the high voltage supply input comprises opening a switch between a voltage regulator and the voltage output and wherein switching on the high voltage supply input comprises closing the switch.

16. The method of claim 13, wherein switching off the low voltage supply input comprises opening a switch between the low voltage supply input and the voltage output and wherein switching on the low voltage supply input comprises closing the switch.

17. The method of claim 13, wherein switching off the high voltage supply input and switching on the low voltage supply input comprises switching a multi-throw switch to a low voltage supply path, and wherein switching on the high voltage supply input and switching off the low voltage supply input comprises switching the multi-throw switch to a regulated high voltage supply path.

18. A device comprising:
a power supply for selecting from a first supply voltage and a second supply voltage based on a length of a single data channel, enabling and disabling a voltage regulator connected to the first supply voltage based on the selecting, and i) providing a constant regulated output voltage derived from the voltage regulator to an output of the power supply if the length of the single data channel is above a threshold length or ii) providing a constant unregulated voltage from the second supply voltage to the output of the power supply if the length of the single data channel is at or below the threshold length;
a serializer for converting a parallel data signal to a serial data signal; and
a transmitter for driving a signal derived from the serial data signal over the single data channel,
wherein the transmitter is powered by the output of the power supply.

19. The device of claim 18, wherein the first supply voltage has a larger amplitude than the second supply voltage.

20. The apparatus of claim 1, further comprising:
a second voltage output configured to switchably receive second constant regulated power from the first voltage input or from the second voltage input;
a voltage mode transmitter including H bridge drivers powered by the second voltage output;
a serializer powered by the first voltage output and configured to provide data to the voltage mode transmitter,
wherein the single data channel is connected to outputs of the voltage mode transmitter, and
wherein the H bridge drivers include p-channel and n-channel field effect transistor pairs connected in an H topology to selectively set the direction of current flow through resistors of the H bridge drivers to control the voltage at the outputs of the voltage mode transmitter.

* * * * *